United States Patent
Okita

(10) Patent No.: US 8,139,148 B2
(45) Date of Patent: Mar. 20, 2012

(54) CAP STRUCTURE

(75) Inventor: Tetsuya Okita, Osaka (JP)

(73) Assignee: Panasonic Corporation, Osaka (JP)

( * ) Notice: Subject to any disclaimer, the term of this patent is extended or adjusted under 35 U.S.C. 154(b) by 241 days.

(21) Appl. No.: 12/713,747

(22) Filed: Feb. 26, 2010

(65) Prior Publication Data

US 2010/0231106 A1 Sep. 16, 2010

(30) Foreign Application Priority Data

Mar. 9, 2009 (JP) .................................. 2009-054529
Feb. 17, 2010 (JP) .................................. 2010-031898

(51) Int. Cl.
*H04N 5/225* (2006.01)
(52) U.S. Cl. ................... 348/376; 348/207.99; 348/373; 361/616; 361/679.01; 439/136; 248/187.1; 248/222.13
(58) Field of Classification Search .......... 348/373–376; 361/600, 616, 625, 629.27, 629.28, 629.58, 361/679.01, 727; 439/136; 455/90.3; 248/177.1, 248/187.1, 222.13, 225.11; D16/202, 208, D16/211, 215, 242, 243, 249, 250, 330, 334
See application file for complete search history.

(56) References Cited

U.S. PATENT DOCUMENTS

| | | | | | |
|---|---|---|---|---|---|
| 7,699,661 | B2 * | 4/2010 | Wu | ................................ | 439/630 |
| 7,703,623 | B2 * | 4/2010 | Katagiri et al. | ............... | 220/264 |
| 7,750,591 | B2 * | 7/2010 | Wang et al. | .................... | 318/480 |
| 2004/0183943 | A1 * | 9/2004 | Suzuki | ......................... | 348/375 |
| 2006/0097694 | A1 * | 5/2006 | Nagura | ......................... | 320/112 |
| 2007/0274054 | A1 * | 11/2007 | Lu et al. | ........................ | 361/727 |
| 2007/0298318 | A1 * | 12/2007 | Li | .................................. | 429/97 |

FOREIGN PATENT DOCUMENTS

JP 11-195450 7/1999
* cited by examiner

*Primary Examiner* — Tuan Ho
*Assistant Examiner* — Kent Wang
(74) *Attorney, Agent, or Firm* — Hamre, Schumann, Mueller & Larson, P.C.

(57) ABSTRACT

A cap 1 attached to housings 2 and 3 can be opened and closed. The cap 1 includes a tongue portion 1a protruding from a cap body 1d; and claw portions engaging with the housing (second outer housing) 3. An elongated hole 1b is formed on the tongue portion 1a. The housing 3 includes: a notched hole 3b for accepting the tongue portion 1a; a stopper 3c that is unremovably inserted into the elongated hole 1b so as to permit relative movement; and engaged portions engaged with the claw portions of the cap 1 to fix the cap 1. When the cap 1 is closed, the stopper 3c is fixed on the elongated hole 1b on the side of the cap body 1d by protrusions 1c provided in the elongated hole 1b.

3 Claims, 6 Drawing Sheets

CAP STRUCTURE

FIELD OF THE INVENTION

The present invention relates to a cap structure for the external terminals of an appliance, the cap structure being attached and held on an appliance body to protect the external terminals.

BACKGROUND OF THE INVENTION

In recent years, many information appliances have external device connecting terminals (hereinafter, will be called external terminals) for connecting the information appliances to other devices such as peripheral devices and power supplies via cables during use. Generally, it has been required to protect external terminals because it is necessary to prevent the entry of dust and prevent damage caused by an impact in a collision with an external object when such information appliances are not connected to other peripheral devices. Thus the external terminals are covered with caps. Some caps are removed completely from appliances when external terminals are used, while others are partially fixed or locked unremovably on appliances. The latter type is used in most portable appliances including video cameras and cellular phones, that is, caps are fixed on appliances to prevent the loss of the caps during use.

For example, Japanese Patent Laid-Open No. 11-195450 describes a cap structure of the prior art. In the cap structure of the prior art, notches are formed on a front case and a rear case, a connector unit is attached near the notches to set a connector, and a connector cap for opening and closing the connector is provided. The connector cap has an integral structure of a fixed portion fixed to the connector unit, a thin plate for opening and closing the notches of the front case and the rear case, a hinge that connects the plate and fixed portion and is reduced in thickness to open and close in a hinged manner, and a claw portion, locked in engagement with the notch of the rear case when the plate is closed. The fixed portion of the cap is fixed to the connector in a case made up of the front case and the rear case, thereby preventing the case and the connector from separating from each other.

When the connector cap is opened to connect a cable terminal from an external appliance to an external terminal, the claw portion is removed from the notch of the rear case, and then the thin hinge is bent partially in a large angle to rotate the connector cap significantly, so that the connector cap is opened.

DISCLOSURE OF THE INVENTION

In the cap structure of the prior art, however, the fixed portion provided on one end of the cap is completely fixed on the case and the connector cap is opened only by rotating the connector cap so as to largely bend the hinge. Thus when the cap is opened to connect a cable terminal from an external appliance to the external terminal, it is necessary to widely open and close the cap to prevent the cap from interfering with the cable terminal or a cable. Disadvantageously, the thin hinge may be broken by a large load and the cap may be torn off.

When a hinge having a larger thickness is formed (increased in thickness) to solve this problem, the opening and closing operations of the cap require a large force, resulting in reduced operability.

The present invention has been devised to solve the problem and difficulty of the prior art. An object of the present invention is to provide a cap structure that can prevent loss and tearing and easily can be opened and closed by a user.

In order to attain the object, a cap structure of the present invention is a cap structure in which a cap attached to a housing can be opened and closed, the cap including: a cap body; a tongue portion made up of a plate-like elastic body and protruding from the cap body; and engaging portions engaging with the housing, the tongue portion having an elongated hole formed thereon, the housing including: a notched hole for accepting the tongue portion; a stopper that is disposed behind the notched hole and is unremovably inserted into the elongated hole so as to permit relative movement in the longitudinal direction of the elongated hole; and engaged portions engaged with the engaging portions of the cap to fix the cap.

With this configuration, the cap is assembled to the housing in a state in which the stopper of the housing is inserted into the elongated hole formed on the tongue portion of the cap. Thus when the cap is opened, the cap is rotated while the tongue portion of the cap is pulled out and bent. In this way, the cap can be opened by pulling out and bending the tongue portion having the elongated hole formed thereon. Thus even when the tongue portion has a large thickness, the cap can be opened easily.

Preferably, the elongated hole of the cap has protrusions formed to come into contact with the stopper and restrict a movement of the cap in the longitudinal direction of the elongated hole. More preferably, the protrusions come into contact with the stopper in a state in which the cap can be closed so as to rotate relative to the housing and are formed at a storing/fixing position for restricting a movement of the cap in a direction along which the cap is pulled out from the housing.

With this configuration, when the cap being closed is pressed to the storing/fixing position where the cap is to be closed, the protrusions come into contact with the stopper and are deformed temporarily to expand. After that, the protrusions return to a position before deformation or a position close to the original position. Thus a user can be notified of the insertion of the cap to the storing/fixing position by click feeling.

With this configuration, even when the tongue portion has a large thickness, the cap can be opened easily and high operability can be maintained for the user. Simultaneously, it is possible to prevent the cap from being lost by tearing and dropping and improve reliability.

Further, in the elongated hole of the cap, the protrusions are formed for restricting a movement of the cap in the direction along which the cap is pulled out from the housing. Thus it is also possible to specify the storing/fixing position of the cap and provide a click feeling when the cap being closed is pressed to the storing/fixing position of the cap. Therefore, it is possible to notify the user of the insertion of the cap to the storing/fixing position, thereby improving convenience.

DESCRIPTION OF THE EMBODIMENT

An embodiment will be described below with reference to the accompanying drawings. A cap structure of the present embodiment is a cap structure for external terminals in a broadcast video camera and is also applicable to appliances other than video cameras.

Figure 1:
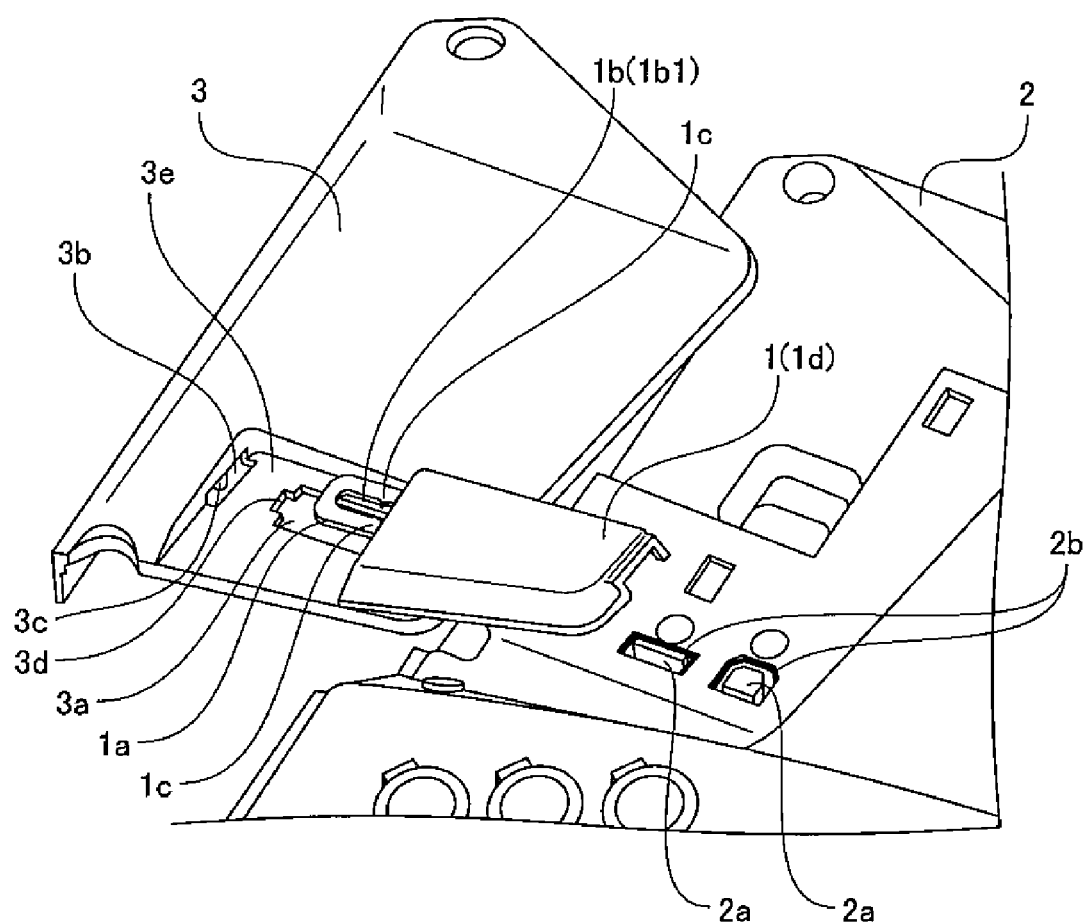
FIG. 1 is an exploded perspective view showing the configuration of a cap structure according to an embodiment.

FIG. 1 is an exploded perspective view showing the configuration of the cap structure according to the present embodiment. In FIG. 1, reference numeral 2 denotes a first outer housing and reference numeral 3 denotes a second outer housing. The first outer housing 2 and the second outer housing 3 constitute the housing of a video camera body. A cap 1 is attached to the second outer housing 3 and acts as a cover for protecting external terminals (external appliance connecting terminals) 2a. On the first outer housing 2, first terminal ports 2b facing the external terminals 2a are provided such that the external terminals 2a disposed inside the first outer housing 2 are exposed to the outside. In other words, the external terminals 2a to be protected by the cap 1 are provided inside the first terminal ports 2b opened on the first outer housing 2.

The second outer housing 3 is attached so as to cover at least the first terminal ports 2b in a region covered with the first outer housing 2. The second outer housing 3 has a recessed portion 3e that is opposed to the first terminal ports 2b. The cap 1 is fit into the recessed portion 3e. The recessed portion 3e may be completely surrounded by walls or as shown in FIG. 1, the walls may be partially removed (shaped to smoothly continue to the edge of the second outer housing 3). The recessed portion 3e has a second terminal port 3a that is opened so as to be opposed to the external terminals 2a and the first terminal ports 2b. On the second outer housing 3, engaged portions 3d for fixing the cap 1 in a locking state are provided on inner walls formed around the second terminal port 3a (the engaged portions 3d are provided at two points in the present embodiment but the configuration is not particularly limited). As shown in drawings including FIG. 2B which will be described later, claw portions 1e acting as engaging portions are provided on the back side of the cap 1. The engaged portions 3d are engaged with the claw portions 1e, so that the cap 1 is fixed at a predetermined position relative to the second outer housing 3. Further, the second outer housing 3 has an inner wall facing the recessed portion 3e and including a long notched hole 3b. The notched hole 3b penetrates from the front side to the back side of the second outer housing 3 and allows the insertion of a tongue portion 1a provided on the cap 1. The long side of the notched hole 3b is slightly longer than the width of the tongue portion 1a and the short side of the notched hole 3b is slightly longer than the thickness of the tongue portion 1a. Near the notched hole 3b on the back side of the second outer housing 3 and on the opposite side of the notched hole 3b from a point where the second terminal port 3a is provided, that is, at the rear of the notched hole 3b, a cylindrical stopper 3c is provided so as to protrude from the back side. The stopper 3c is inserted into an elongated hole 1b of the cap 1 when the cap 1 is assembled to the second outer housing 3. The stopper 3c is long enough that the end of the stopper 3c comes into contact with the first outer housing 2 when the second outer housing 3 is assembled to the first outer housing 2. The stopper 3c prevents the cap 1 from being removed and separated from the second outer housing 3. Further, a clearance may be provided between the end of the stopper 3c and the first outer housing 2. In this case, the clearance is set smaller than the thickness of the tongue portion 1a of the cap 1. The relationship between the stopper 3c and the cap 1 will be described later.

Figure 2A:
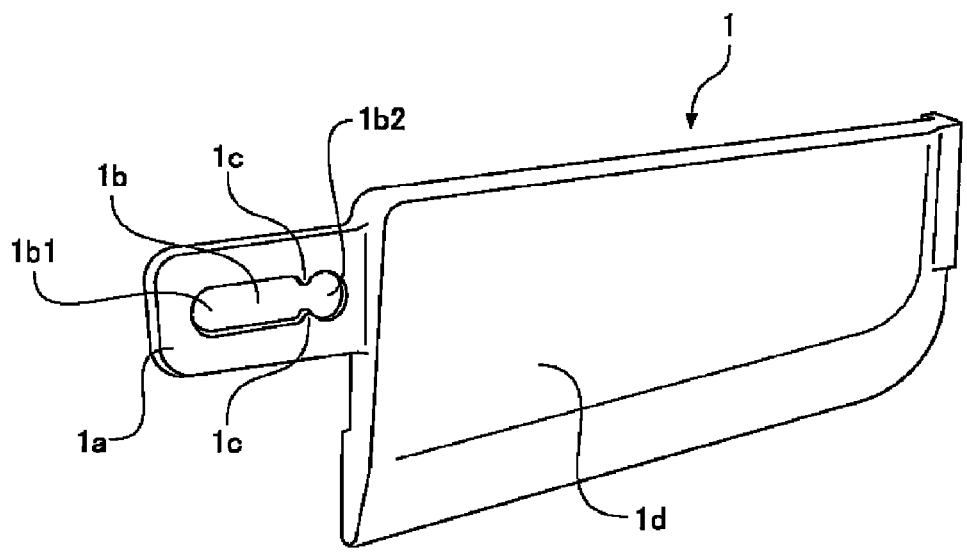
FIG. 2A is a perspective view showing a cap of the cap structure from the front side (outside)
Figure 2B:
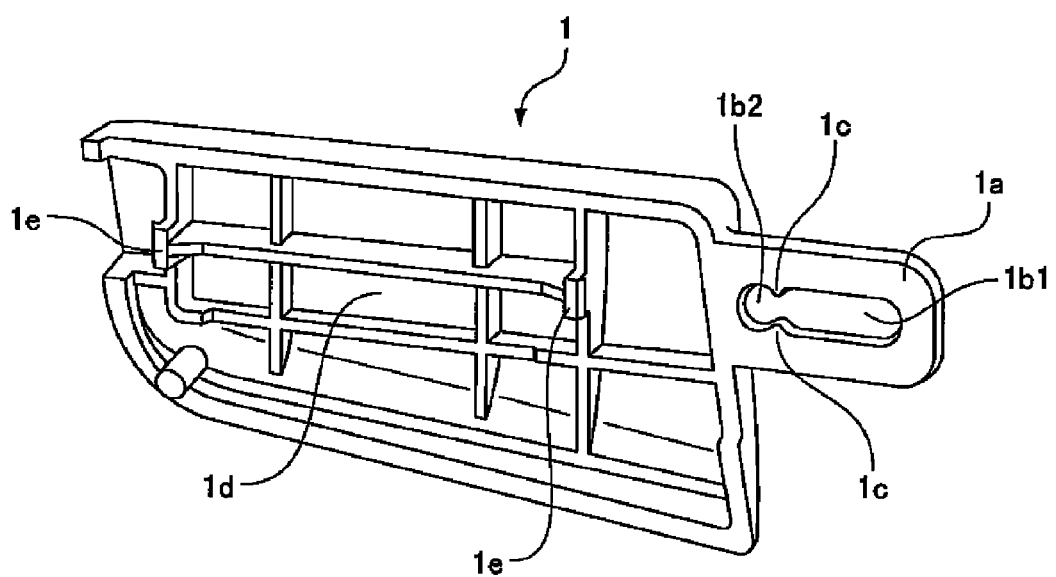
FIG. 2B is a perspective view showing the cap of the cap structure from the back side (inside)

FIGS. 2A and 2B are perspective views showing the cap 1 of the cap structure according to the present embodiment. FIG. 2A is the perspective view of the cap 1 taken from the front side (outside) and FIG. 2B is the perspective view of the cap 1 taken from the back side (inside). The cap 1 has a cap body 1d for protecting the external terminals 2a, and the plate-like tongue portion 1a. The tongue portion 1a is substantially rectangular in plan view and protrudes from the bottom of the cap body 1d in the thickness direction, that is, from a position closest to the second outer housing 3 when the cap 1 is assembled to the second outer housing 3. At least the tongue portion 1a of the cap 1 is made up of an elastic body such as a thermoplastic elastomer or rubber. The tongue portion 1a has the elongated hole 1b extended along the longitudinal direction of the tongue portion 1a. In a location where the elongated hole 1b is formed, the inner wall partially has a pair of protrusions 1c that are opposed to each other at a position close to the cap body 1d. The protrusions 1c are provided at a certain distance from one end of the elongated hole 1b on the side of the cap body 1d and the distance is substantially equal to or slightly shorter than the diameter of the stopper 3c. In the elongated hole 1b, a portion between the protrusions 1c and the cap body 1d will be called a fixing hole 1b2 and the other portion will be called a pulling hole 1b1. As previously mentioned, on the back side of the cap body 1d, the claw portions 1e correspond to the engaged portions 3d. The claw portions 1e act as engaging portions with the engaged portions 3d when the cap body 1d is fit into the recessed portion 3e of the second outer housing 3.

When the video camera is assembled, the cap 1 first is assembled to the second outer housing 3, and then the second outer housing 3 is assembled to the first outer housing 2. When the cap 1 is assembled to the second outer housing 3, the tongue portion 1a of the cap 1 first is inserted into the notched hole 3b of the second housing 3 from the front side to the back side. At this point, for example, in a state in which the second outer housing 3 is held in a horizontal position, the tongue portion 1a is inserted in a diagonal vertical position into the notched hole 3b, so that the tongue portion 1a can be inserted without engaging the stopper 3c. Next, the stopper 3c of the second outer housing 3 is inserted into the elongated hole 1b of the cap 1 by rotating the cap 1 to, e.g., a horizontal position. At this point, the stopper 3c is fit into the fixing hole 1b2 in the elongated hole 1b of the cap 1. When the stopper 3c is placed in the fixing hole 1b2, the protrusions 1c come into contact with the stopper 3c and the stopper 3c is fit into the fixing hole 1b2, so that the stopper 3c is fixed (locked) in the fixing hole 1b2. At this point, the tongue portion 1a is inserted completely into the notched hole 3b and the cap body 1d is positioned so as to be opposed perfectly to the recessed portion 3e. In this state, the cap body 1d is pressed to the second outer housing 3 and is stored in the recessed portion 3e, so that the claw portions 1e on the back side of the cap body 1d are engaged with the engaged portions 3d of the second outer housing 3. Thus the cap 1 is fixed in engagement with the second outer housing 3. After that, the second outer housing 3 is assembled to the first outer housing 2 with screws and the like, so that the stopper 3c comes into contact with the first outer housing 2 and the tongue portion 1a does not drop off the stopper 3c, in other words, it is possible to prevent the cap 1 from dropping off the housing of the video camera.

Figure 8:
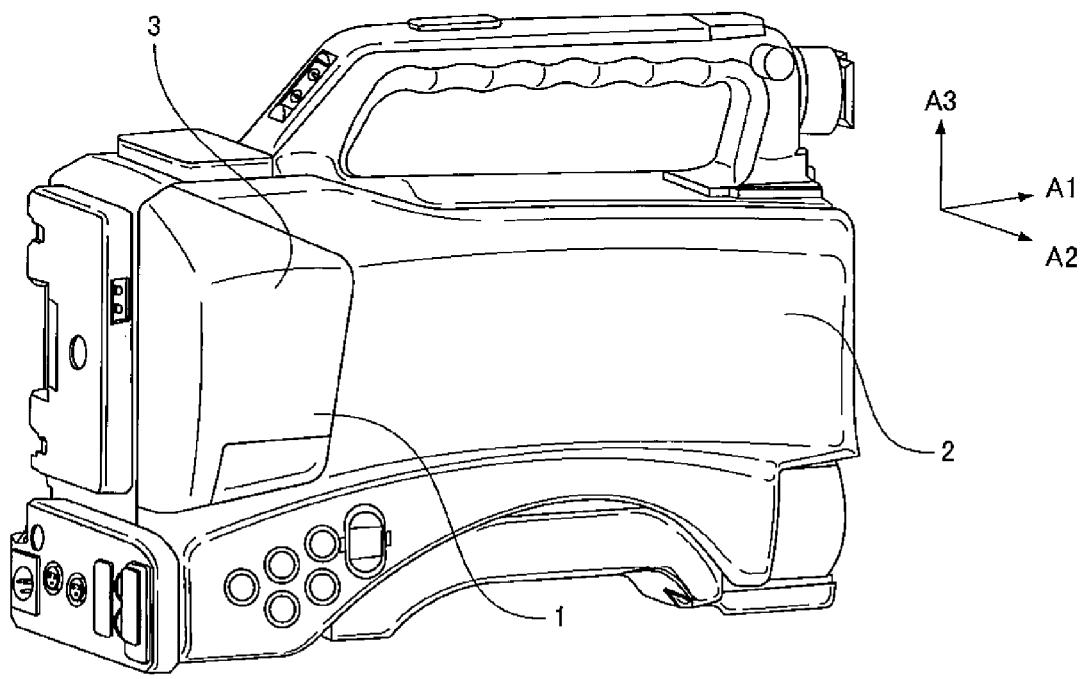
FIG. 8 is a perspective view showing the overall configuration of a video camera having the cap structure of the present embodiment.

FIG. 8 is a perspective view showing the overall configuration of the video camera having the cap structure of the present embodiment with the cap 1 closed. In FIG. 8, a direction A1 indicates the front of the video camera, a direction A2 indicates the right direction of the video camera, and a direction A3 indicates the upward direction of the video camera. In a state in which the cap 1 has been assembled according to the foregoing steps, the cap 1 is closed as shown in FIG. 8.

Figure 3:
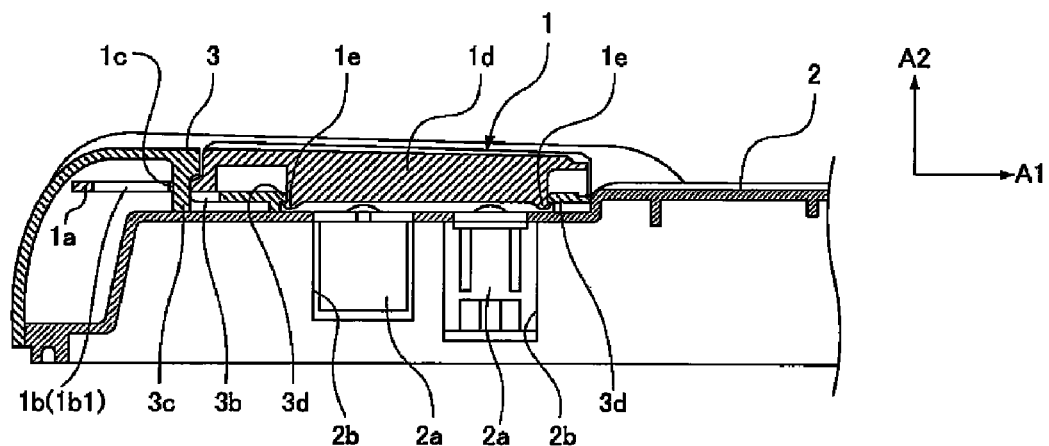
FIG. 3 is a plan sectional view showing the cap structure in which the cap is closed.
Figure 4:
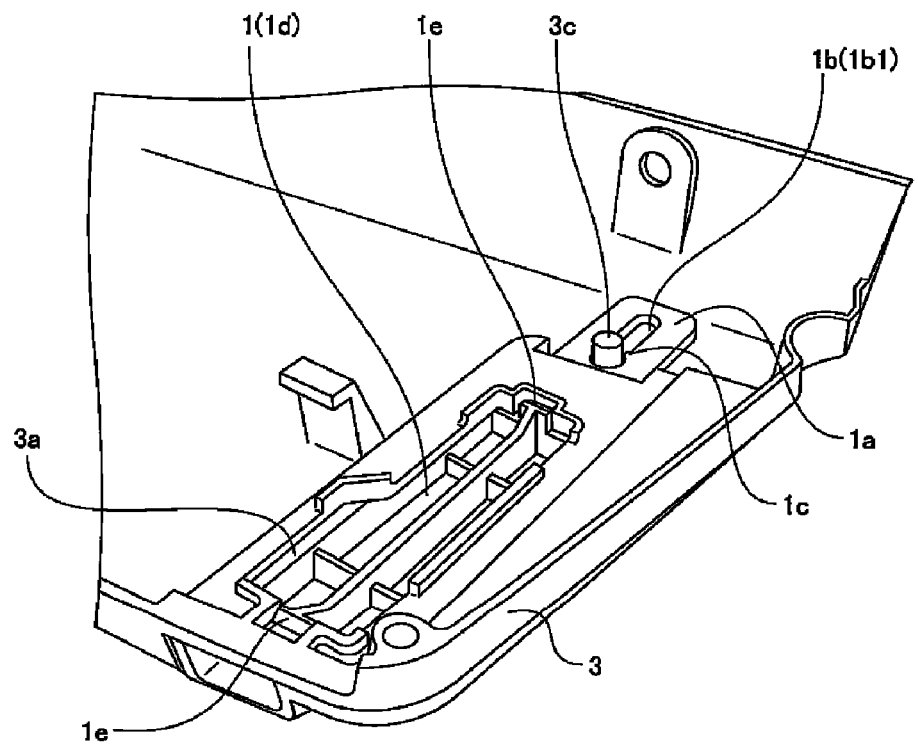
FIG. 4 is a perspective view showing the closed cap and a second outer housing of the cap structure from the back side (inside)

FIG. 3 is a plan sectional view showing the cap structure in which the cap 1 is closed. Further, FIG. 3 is a sectional view of the video camera taken along the horizontal direction (a plane along the direction A1), that is, taken along a plane perpendicular to an axis A3 of FIG. 8. FIG. 4 is a perspective view showing the closed cap and the second outer housing of the cap structure from the back side (inside). As shown in FIGS. 3 and 4, in a state in which the cap 1 is closed, the tongue portion 1a of the cap 1 is inserted into the notched hole 3b of the second outer housing 3 from the front to the rear and the stopper 3c of the second outer housing 3 is inserted into the fixing hole 1b2 of the elongated hole 1b of the cap 1. The protrusions 1c are placed behind the stopper 3c and fix the stopper 3c in the fixing hole 1b2.

Next, the opening operation of the cap 1 will be described below. The front end of the cap body 1d is rotated to the outside, that is, in the direction A2 with the front end of the cap body 1d (a portion around the joint of the cap body 1d and the tongue portion 1a) serving as the center of rotation, and the cap body 1d is slightly raised from the recessed portion 3e of the second outer housing 3. Thus the claw portions 1e on the back side of the cap body 1d are disengaged from the engaged portions 3d of the second outer housing 3.

Figure 5:
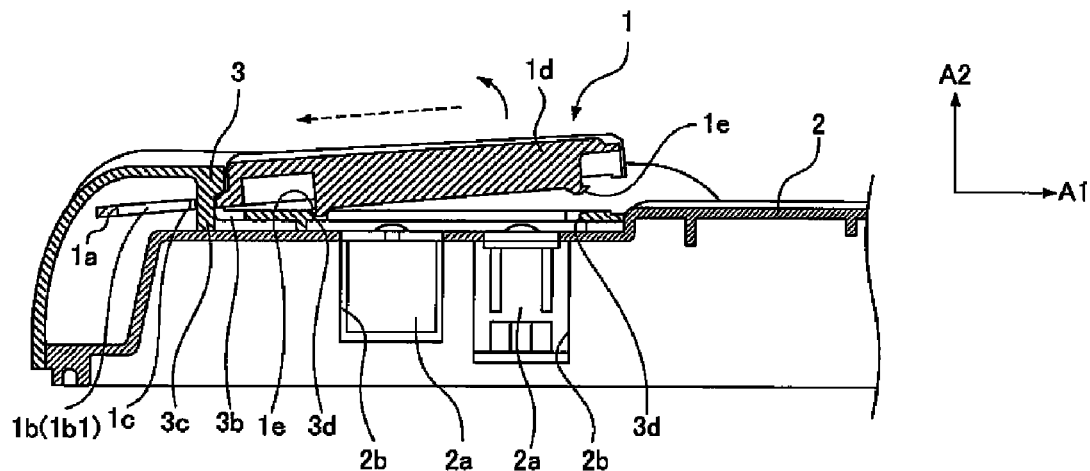
FIG. 5 is a plan sectional view for explaining the opening and closing operations of the cap of the cap structure and explaining a state in which the cap is rotated slightly to open from a closed state.

FIG. 5 is a plan sectional view showing a state in which the cap 1 of the cap structure is rotated to slightly open from the closed state, that is, a state immediately after the disengagement of the claw portions 1e and the engaged portions 3d. The front end of the cap body 1d is rotated further in the direction A2 from this state, so that the upper corner of the rear end of the cap body 1d in the thickness direction comes into contact with the wall of the recessed portion 3e of the second outer housing 3 and acts as a fulcrum. Thus the tongue portion 1a is pulled out of the notched hole 3b by leverage. At this point, the protrusions 1c are moved over the stopper 3c and are pulled in the direction A1, so that the stopper 3c is placed in the pulling hole 1b1 in the notched hole 3b. Further, the cap body 1d is rotated while being pulled out, so that the tongue portion 1a is bent by elastic deformation and the cap 1 is opened.

Figure 6:
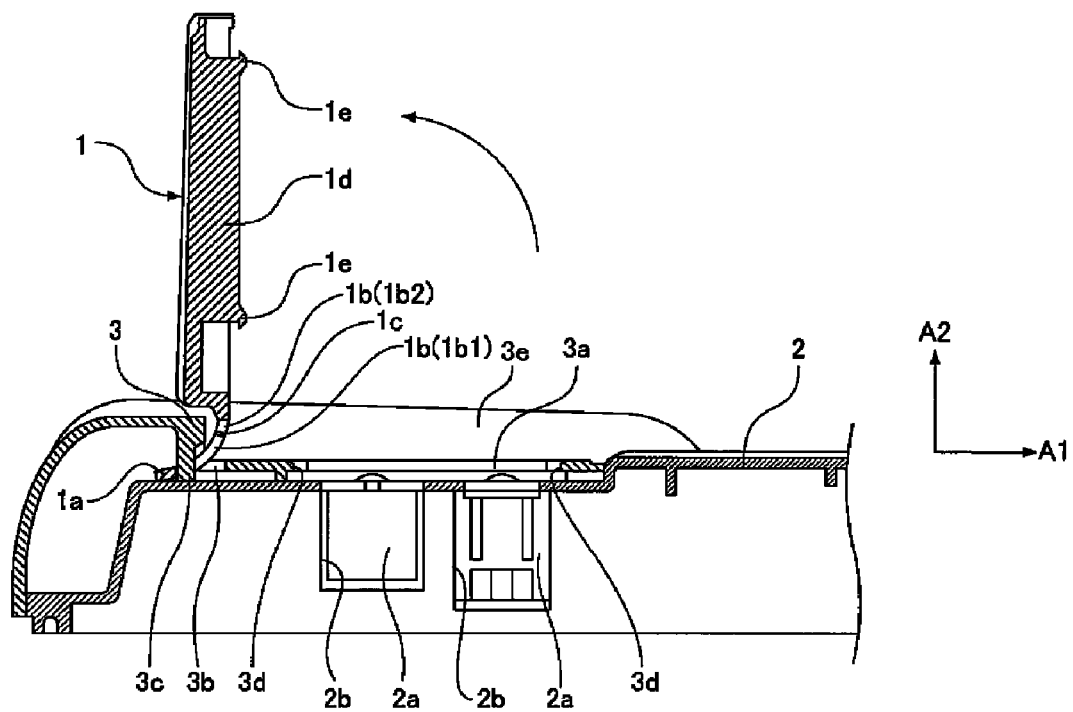
FIG. 6 is a plan sectional view showing a state in which the cap of the cap structure has been pulled out and opened.

FIG. 6 is a plan sectional view showing a state in which the cap 1 of the cap structure has been pulled out and opened. In a state in which the cap 1 is completely pulled out, the stopper 3c in the pulling hole 1b1 of the elongated hole 1b is located at the farthest position from the cap body 1d. However, the cap 1 does not completely drop off the notched hole 3b because the stopper 3c is in contact with the first outer housing 2.

Figure 9:
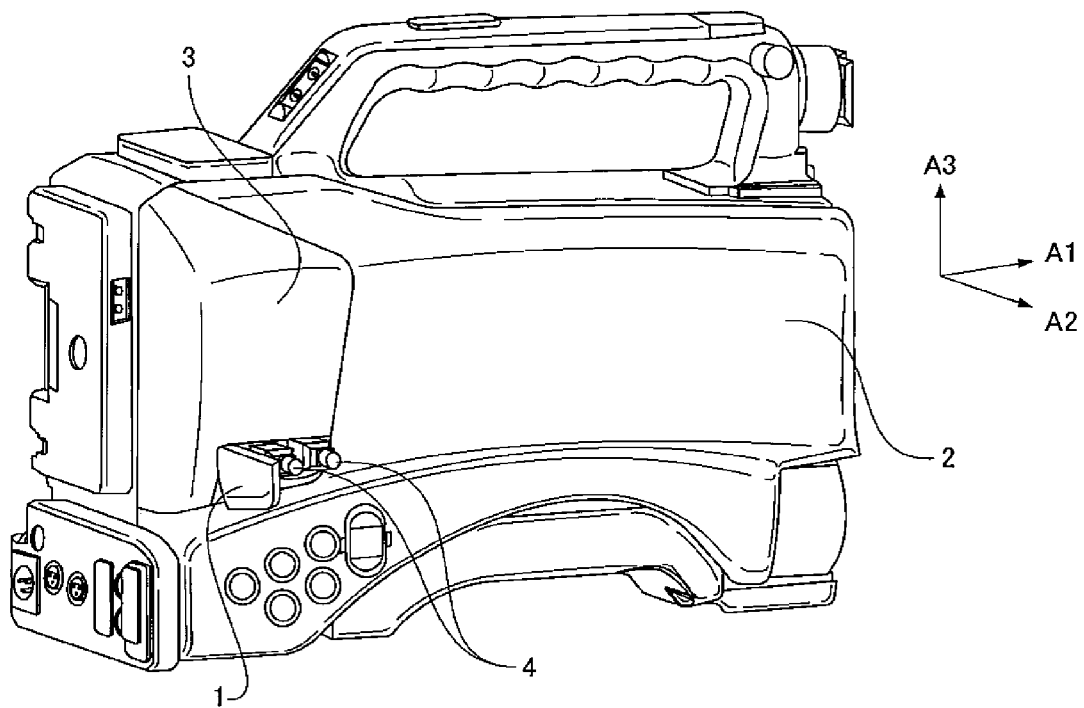
FIG. 9 is a perspective view showing the overall configuration of the video camera having the cap structure of the present embodiment, in a state in which cable terminals are connected to the video camera.

FIG. 9 is a perspective view showing the overall configuration of the video camera having the cap structure of the present embodiment with the cap 1 opened and cable terminals 4 connected to the external terminals 2a. As shown in FIG. 9, when the cable terminals 4 from an external appliance are connected to the external terminals 2a, the cap 1 is pulled out to a position not interfering with the cable terminals 4 or cables (not shown). In this way, the tongue portion 1a, which is an elastic body, is bent by elastic deformation while being pulled out, so that the cap 1 can be opened widely and the cable terminals 4 readily can be connected to the external terminals 2a before use.

Next, the closing operation of the cap 1 will be described below. When the cap 1 is left after the cable terminals 4 are removed with the cap 1 opened as shown in FIG. 9, the elastically deformed tongue portion 1a returns to the original shape.

Figure 7:
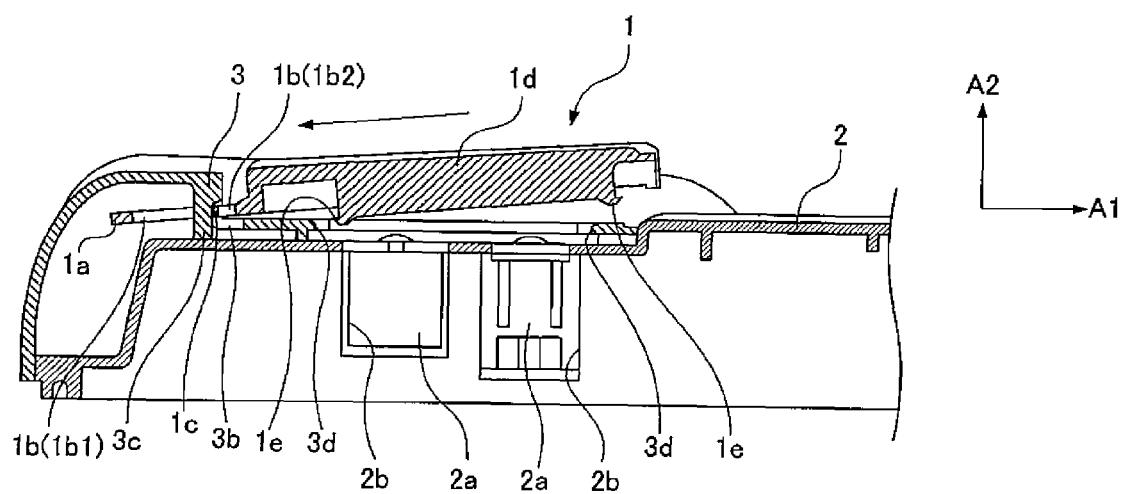
FIG. 7 is a plan sectional view for explaining the opening and closing operations of the cap in a state immediately before a stopper and protrusions of the cap structure are fit to each other.

FIG. 7 is a plan sectional view showing a state immediately before the stopper 3c is fit into the fixing hole 1b2 over the protrusions 1c when the cap 1 is being closed. When the cap 1 is being closed, the bent tongue portion 1a naturally returns to the original state (straight shape), so that the cap 1 assumes the state of FIG. 7. At this point, the protrusions 1c are placed in front of the stopper 3c, that is, the protrusions 1c are shifted from the stopper 3c in the direction A1 (in the forward direction of an axis A1), and the stopper 3c is placed in the pulling hole 1b1. In this state, the cap body 1d is pressed so as to press the tongue portion 1a into the rear of the notched hole 3b, so that the elongated hole 1b of the tongue portion 1a is deformed elastically to the outside so as to move the protrusions 1c over the stopper 3c to the rear side, that is, in the negative direction of the axis A1 relative to the stopper 3c. Consequently, the stopper 3c is placed in the fixing hole 1b2 (see FIG. 5) and is fixed while being locked by the protrusions 1c on the end of the elongated hole 1b on the side of the cap body 1d.

A state immediately after the stopper 3c and the protrusions 1c are engaged with each other to close the cap 1 is similar to that of FIG. 5. At the transition from the state of FIG. 7 to that of FIG. 5, a click feeling and fitting feeling are provided when the protrusions 1c come into contact with the stopper 3c and the stopper 3c is fit into the fixing hole 1b2 over the protrusions 1c. In this way, the stopper 3c guides the movement of the cap 1 along the elongated hole 1b and provides a click feeling by making contact with the protrusions 1c when the cap 1 is being closed. Further, the stopper 3c is fit to the protrusions 1c and is fixed (locked) in the fixing hole 1b2 of the elongated hole 1b when the cap 1 is closed.

Finally, in the state of FIG. 5, the cap body 1d is pressed into the second outer housing 3 (in the negative direction of an axis A2) and is stored in the recessed portion 3e, so that the claw portions 1e on the back side of the cap body 1d are engaged with the engaged portions 3d of the second outer housing 3. Thus the cap 1 is fixed in engagement with the second outer housing 3 and the cap 1 enters the closing state of FIG. 3. At this point, the stopper 3c is still engaged (fixed) with the end of the elongated hole 1b on the side of the cap body 1d by the protrusions 1c.

With this configuration, the number of components is small and the closed second outer housing 3 and cap 1 are first fixed upon assembling. Thus the second outer housing 3 can be assembled to the first outer housing 2 after the cap 1 is assembled into the second outer housing 3, thereby facilitating assembling.

Moreover, the stopper 3c of the second outer housing 3 is inserted into the elongated hole 1b of the tongue portion 1a of the cap 1, and the cap 1 is engaged with the stopper 3c of the second outer housing 3 movably along the elongated hole 1b. The slightly opened cap 1 can move freely over a large area relative to the second outer housing 3. Thus when the cap 1 is being opened, the position of the opened cap 1 can be changed easily without largely bending a part of the tongue portion 1a of the cap 1. For this reason, even when the tongue portion 1a of the cap 1 has a large thickness, the cap 1 can be opened easily in a satisfactory manner. In other words, even when the bent tongue portion 1a of the opened cap 1 has a relatively large thickness, the opening operation of the cap 1 is not affected. Thus by increasing the thickness of the tongue portion 1a, it is possible to eliminate breaks on a hinge during repeated opening and closing operations and prevent the cap from being torn off, thereby achieving high reliability for the cap structure as compared with the cap structure using the hinge according to the prior art. Further, the protrusions 1c for providing a click feeling also can be increased in thickness, so that the protrusions 1c are resistant to wear and the click feeling is not lost even after regular use.

Moreover, a user opens the cap 1 only by rotating the cap 1 in the direction A3 instead of pulling out and rotating the cap, so that the tongue portion 1a of the cap 1 is bent, the fitting margin of the protrusions 1c and the stopper 3c is reduced, and the cap 1 can be pulled out and opened without resistance. Thus the cap can be opened easily by the user. Further, when the cap 1 is closed, a click feeling on the protrusions 1c is provided by a movement in the negative direction A1 for pressing the tongue portion 1a into the second outer housing 3, so that the user can confirm that the cap 1 has been closed and the cap body 1d can be positioned reliably. Thus it is also possible to prevent the user from forcibly closing the cap 1 with an excessive load applied to the cap 1.

In the present embodiment, the second outer housing 3 is shaped to cover the external terminals 2a. It is not always necessary to cover the external terminals 2a with the second outer housing 3 and it is only necessary to provide at least the stopper 3c and the notched hole 3b and lock the cap 1 by some method as will be described later.

Further, in the present embodiment, the stopper 3c and the first outer housing 2 are brought into contact with each other to prevent the tongue portion 1a from dropping off the stopper 3c. A member for preventing the tongue portion 1a from dropping off may be attached to the stopper 3c after the stopper 3c is inserted into the elongated hole 1b of the tongue portion 1a. Thus it is possible freely to set the positional relationship between the stopper 3c and the first outer housing 2 and integrally form the first outer housing 2 and the second outer housing 3. In other words, the first outer housing 2 may be omitted and the second outer housing 3 may constitute the housing body of an appliance.

Moreover, the cap 1 and the second outer housing 3 are fixed by engaging the claw portions 1e of the cap body 1d with the engaged portions 3d of the second outer housing 3. The present invention is not limited to this configuration. For example, the cap 1 and the second outer housing 3 may be fixed by engaging pins on the back side of the cap body 1d with holes provided on the second outer housing 3, fitting the cap body 1d into the recessed portion 3e, or fixing the cap body 1d and the second outer housing 3 with a hook and loop faster, a magnet, and so on.

The cap structure of the present embodiment can prevent the cap from being lost by tearing and dropping and facilitate the opening and closing operations of the user. Thus the present invention is useful as a cap and the like attached and held for external terminals on a body to protect the external terminals of an appliance. The same structure is also applicable to various appliances other than a video camera.

What is claimed is:

1. A cap structure in which a cap attached to a housing can be opened and closed,
    the cap comprising:
    a cap body;
    a tongue portion made up of a plate-like elastic body and protruding from the cap body; and
    engaging portions engaging with the housing,
    the tongue portion having an elongated hole formed thereon,
    the housing comprising:
    a notched hole for accepting the tongue portion;
    a stopper that is disposed behind the notched hole and is unremovably inserted into the elongated hole so as to permit relative movement in a longitudinal direction of the elongated hole; and
    engaged portions engaged with the engaging portions of the cap to fix the cap.

2. The cap structure according to claim 1, wherein the elongated hole of the cap has protrusions formed to come into contact with the stopper and restrict a movement of the cap in the longitudinal direction of the elongated hole.

3. The cap structure according to claim 2, wherein the protrusions come into contact with the stopper in a state in which the cap is closed on the housing and are formed at a storing/fixing position for restricting a movement of the cap in a direction along which the cap is pulled out from the housing.

* * * * *